(12) United States Patent
Terasaka et al.

(10) Patent No.: US 11,291,966 B2
(45) Date of Patent: Apr. 5, 2022

(54) MIXER AND VAPORIZATION APPARATUS

(71) Applicant: HORIBA STEC, Co., Ltd., Kyoto (JP)

(72) Inventors: Masanori Terasaka, Kyoto (JP); Hidenori Oba, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 567 days.

(21) Appl. No.: 16/217,423

(22) Filed: Dec. 12, 2018

(65) Prior Publication Data

US 2019/0184350 A1  Jun. 20, 2019

(30) Foreign Application Priority Data

Dec. 14, 2017  (JP) .............................. JP2017-239255

(51) Int. Cl.
*B01F 25/43* (2022.01)
*B01F 25/00* (2022.01)

(52) U.S. Cl.
CPC ......... *B01F 25/43* (2022.01); *B01F 2025/911* (2022.01); *B01F 2025/919* (2022.01); *B01F 2025/931* (2022.01)

(58) Field of Classification Search
CPC ............................... B01F 5/0609; B01F 25/43
USPC ......................................... 366/146, 339, 340
See application file for complete search history.

(56) References Cited

U.S. PATENT DOCUMENTS

| | | | | |
|---|---|---|---|---|
| 1,373,829 A * | 4/1921 | Perdue | .................. | F23D 14/465 239/427 |
| 5,037,584 A * | 8/1991 | Toll | ....................... | B01F 5/0656 261/76 |
| 6,910,797 B2 * | 6/2005 | Falcon | ................ | B01F 13/0076 366/127 |
| 7,066,409 B2 * | 6/2006 | Negoro | ................. | B05B 1/3447 138/42 |
| 10,279,324 B2 * | 5/2019 | Komazawa | ............. | B24B 55/02 |

(Continued)

FOREIGN PATENT DOCUMENTS

| | | |
|---|---|---|
| JP | 56-044032 A | 4/1981 |
| JP | 10-043563 A | 2/1998 |

(Continued)

OTHER PUBLICATIONS

Japan Patent Office, Office Action Issued in Application No. 2017-239255, dated Jun. 1, 2021, 8 pages.

*Primary Examiner* — David L Sorkin
(74) *Attorney, Agent, or Firm* — Alleman Hall Creasman & Tuttle LLP

(57) ABSTRACT

A mixer is adapted to include: a flow path forming member formed with an internal flow path; and an insertion member inserted into the internal flow path, in which: the inner circumferential surface forming the internal flow path in the flow path forming member or the outer circumferential surface of the insertion member is formed with a first groove and a second groove merging with the first groove and branching from the first groove, and the inner circumferential surface and the outer circumferential surface are fitted to each other; and the first groove and the second groove are formed as a mixing flow path for, between the flow path forming member and the insertion member, branching and merging fluid flowing from one side of the internal flow path and guiding the fluid to the other side of the internal flow path.

11 Claims, 9 Drawing Sheets

(56) References Cited

U.S. PATENT DOCUMENTS

| | | | |
|---|---|---|---|
| 2006/0028908 A1* | 2/2006 | Suriadi | F16K 99/0001 366/146 |
| 2009/0097831 A1 | 4/2009 | Nishikawa et al. | |
| 2014/0264132 A1* | 9/2014 | Parish | F16K 47/04 251/356 |

FOREIGN PATENT DOCUMENTS

| | | |
|---|---|---|
| JP | 11-028349 A | 2/1999 |
| JP | 5475817 B2 | 4/2014 |
| JP | 2014233655 A | 12/2014 |
| WO | 2007114474 A1 | 10/2007 |

* cited by examiner

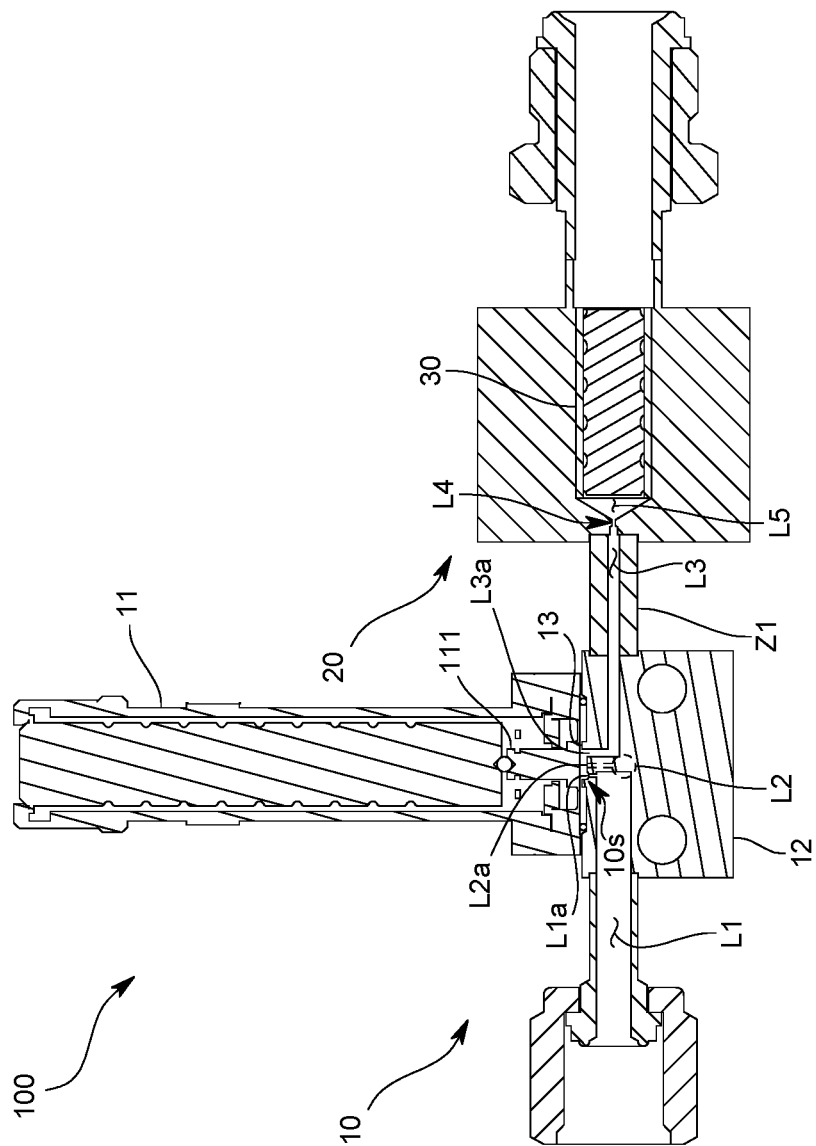

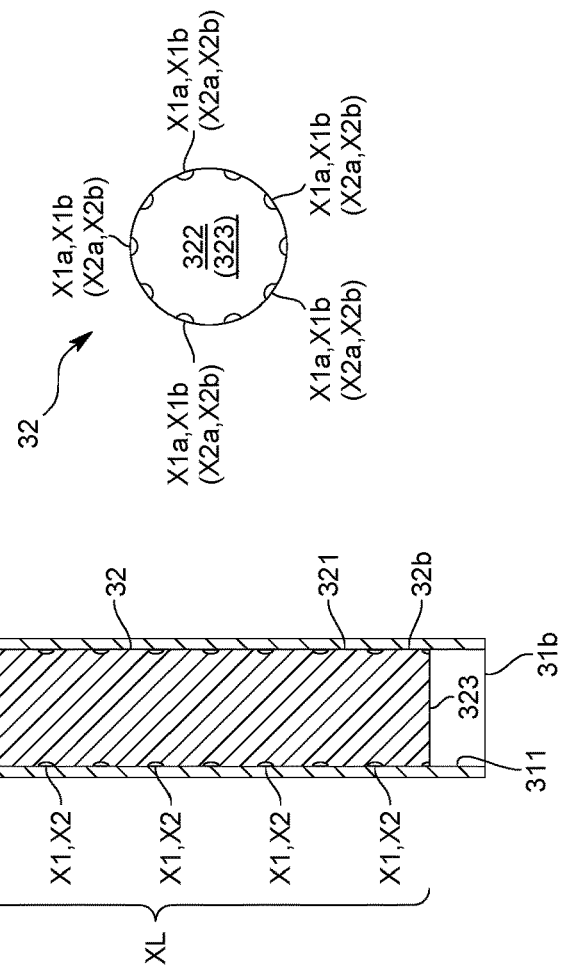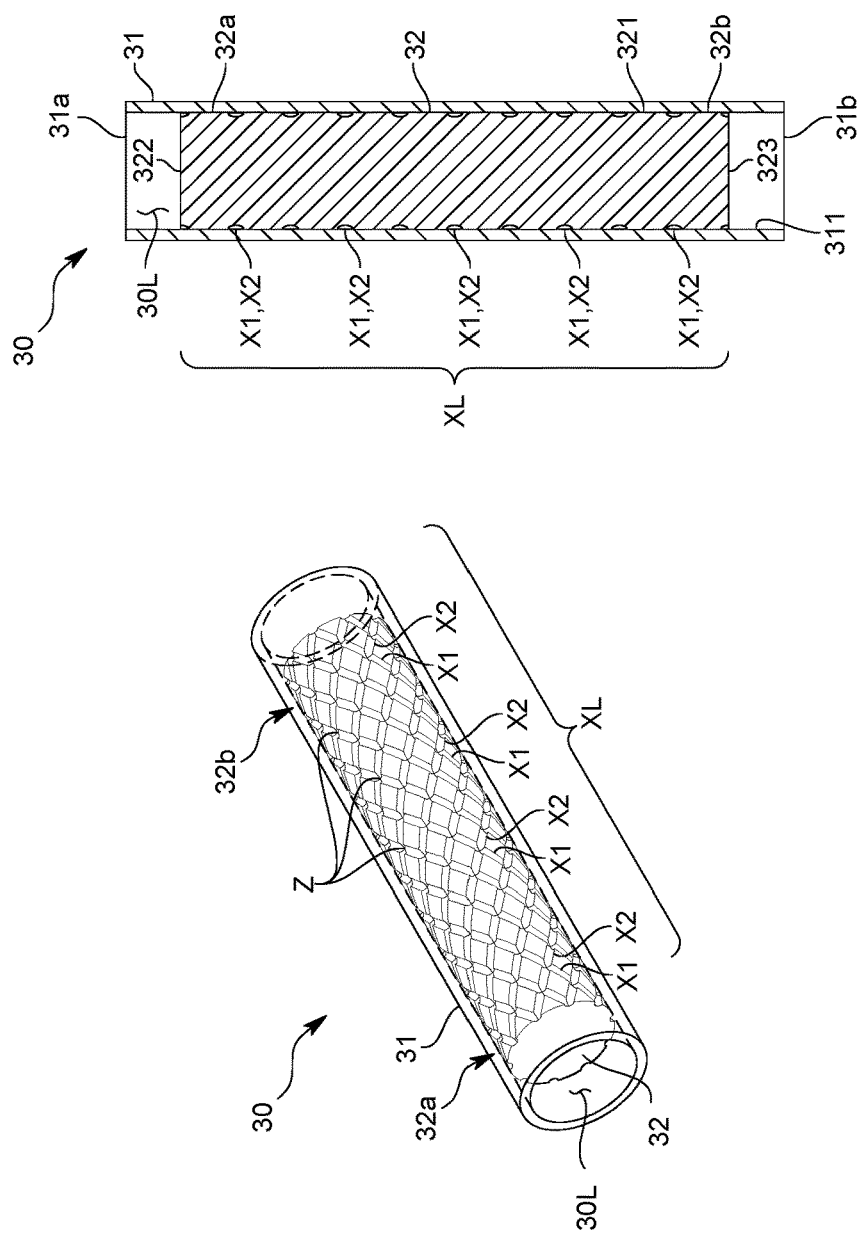

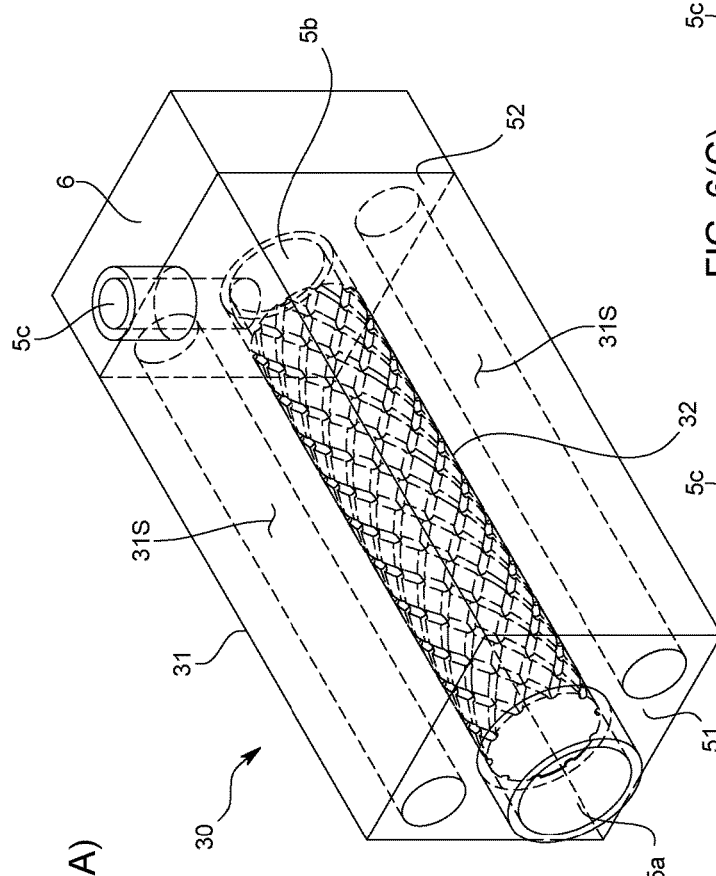
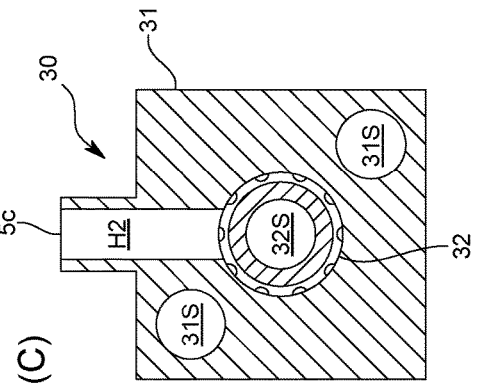
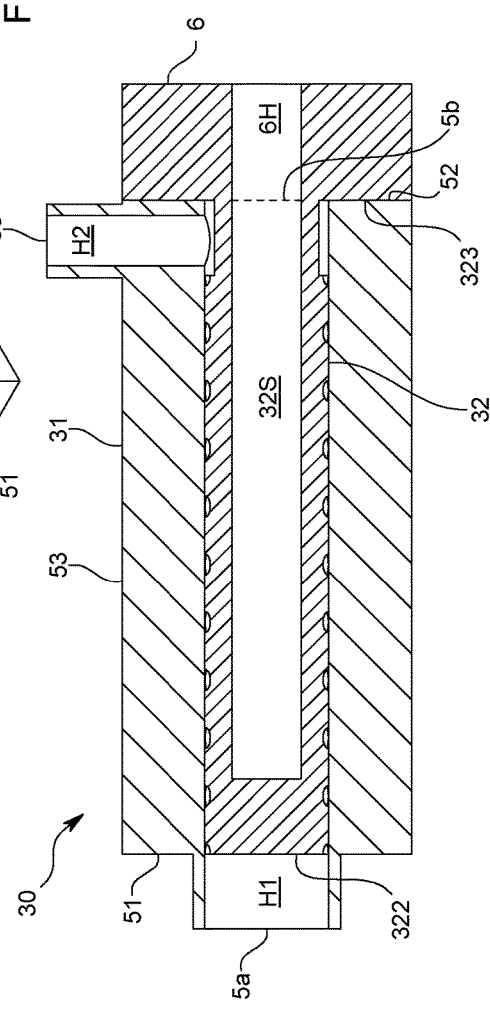
FIG. 6(A)
FIG. 6(B)
FIG. 6(C)

MIXER AND VAPORIZATION APPARATUS

TECHNICAL FIELD

The present invention relates to a mixer for mixing fluids and a vaporization apparatus including the mixer.

BACKGROUND ART

For example, as a vaporization apparatus used in a semiconductor manufacturing process such as a deposition process, as disclosed in Patent Literature 1, there is one including a mixer for mixing multiple types of fluids. In addition, the mixer mixes a liquid material and carrier gas, and by discharging the resulting mixed fluid from a nozzle to depressurize it, the liquid material is vaporized.

As such a mixer, as disclosed in Patent Literature 2, there is one referred to as a so-called static mixer formed in a spiral shape by twisting a flat plate, and the static mixer is fitted into a pipe through which mixed fluid flows. As a result, the inside of the pipe is divided into a flow path through which the fluid flows along the front surface of the static mixer and a flow path through which the fluid flows along the back surface of the static mixer. In addition, the mixed fluid spirally flows, and thereby a liquid material and carrier gas are mixed.

However, when using the above-described mixer, the inside of the pipe is divided into only the two flow paths along the front and back surfaces of the static mixer, and therefore when attempting to improve mixing performance, there occurs a problem of causing an increase in the size of an apparatus, such as fitting a long static mixer into a long pipe.

CITATION LIST

Patent Literatures

Patent Literature 1: Japanese Patent No. 5475817
Patent Literature 2: Japanese Unexamined Patent Application Publication No. 2014-233655

SUMMARY OF INVENTION

Technical Problem

Therefore, the present invention has been made in order to solve the above-described problem, and a main object thereof is to provide a mixer having higher mixing performance than in the past, and consequently to mix multiple types of fluids well without causing an increase in the size of an apparatus.

Solution to Problem

That is, the mixer according to the present invention includes: a flow path forming member formed with an internal flow path; and an insertion member inserted into the internal flow path. In addition, the inner circumferential surface forming the internal flow path in the flow path forming member or the outer circumferential surface of the insertion member is formed with a first groove and a second groove merging with the first groove and branching from the first groove, and the inner circumferential surface and the outer circumferential surface are fitted to each other. Further, the first groove and the second groove are formed as a mixing flow path for, between the flow path forming member and the insertion member, branching and merging fluid flowing from one side of the internal flow path and guiding the fluid to the other side of the internal flow path.

Such a mixer can improve mixing performance more than in the past, and consequently mix multiple types of fluids such as gas and liquid well without causing an increase in the size of an apparatus because mixed fluid consisting of the multiple types of fluids flows through the mixing flow path while branching and merging by flowing the mixed fluid through the internal flow path of the flow path forming member. Note that the term "mixing" here refers to a concept also including the meaning that the state (including, for example, concentration, temperature, and the like) of the mixed fluid is uniformed.

It is preferable that multiple first grooves are formed in the outer circumferential surface of the insertion member from the outer edge of one end part of the insertion member to the outer edge of the other end part of the insertion member; multiple second grooves are formed in the outer circumferential surface of the insertion member from the outer edge of the one end part of the insertion member to the outer edge of the other end part of the insertion member; and multiple branching points or multiple merging points between the first grooves and the second grooves are provided.

In such a configuration, since the multiple branching points or multiple merging points between the first grooves and the second grooves are provided, the fluid can be repeatedly branched or merged at the branching points or the merging points, and therefore the multiple types of fluids can be mixed well.

It is preferable that the first grooves and the second grooves are of a spiral shape, and the winding direction of the first grooves and the winding direction of the second grooves are opposite to each other.

In such a configuration, the fluid flowing through the first grooves and the fluid flowing through the second grooves collide with each other at the merging points, and therefore at the merging points, the multiple types of fluid can be mixed better.

It is preferable that the flow path forming member includes a first heater containing space containing a first heater for heating the fluid.

In such a configuration, the fluid flowing through the mixing flow path can be heated from outside by the first heater contained in the first heater containing space, and therefore, for example, the vaporization efficiency of the fluid can be improved.

It is preferable that the insertion member includes a second heater containing space containing a second heater for heating the fluid.

In such a configuration, the fluid can be heated from inside by the second heater contained in the second heater containing space, and therefore, for example, the vaporization efficiency of the fluid can be improved.

Specific embodiments include a configuration in which: the flow path forming member is formed in a block body shape, and includes a first through-hole that communicates between a first port formed in a first wall surface and a second port formed in a second wall surface on the side opposite to the first wall surface and is also inserted with the insertion member, and a second through-hole that communicates between a third port formed in a wall surface different from the second wall surface and the first through-hole; the second port is blocked with the second heater inserted into the second heater containing space through the second port; and one of the first port and the third port is formed as a fluid inflow port for the fluid, and also the other is formed as an outflow port for the fluid.

It is preferable that at the connection point between the first through-hole and the second through-hole, the fluid flows along a tangential direction of the inner circumferential surface forming the first through-hole.

Such a configuration makes it possible to generate a swirling flow, and thereby make the fluid efficiently flow in/out.

In order to easily guide the fluid flowing through the internal flow path and reaching the insertion member to the respective grooves, it is preferable that the insertion member includes a guide surface that is formed in a tapered shape tapering toward the upstream side.

In order to further easily guide the fluid to the respective grooves, it is preferable that multiple guide grooves communicating with the respective grooves are formed in the guide surface.

Also, the vaporization apparatus according to the present invention is one that vaporizes fluid to produce vaporized gas and includes the above-described mixer. Such a vaporization apparatus can produce the same working effects as those of the above-described mixer.

Advantageous Effects of Invention

According to the present invention configured as described above, it is possible to improve mixing performance more than in the past, and consequently to mix multiple types of fluids well without causing an increase in the size of an apparatus.

BRIEF DESCRIPTION OF DRAWINGS

FIG. 1 is a diagram schematically illustrating the overall configuration of a vaporization apparatus of the present embodiment;

FIGS. 2(A), 2(B) and 2(C) are diagrams schematically illustrating the configuration of a mixer of the same embodiment;

FIGS. 6(A), 6(B) and 6(C) are diagrams schematically illustrating the configuration of a mixer in still yet another embodiment;

DESCRIPTION OF EMBODIMENTS

Figure 3:
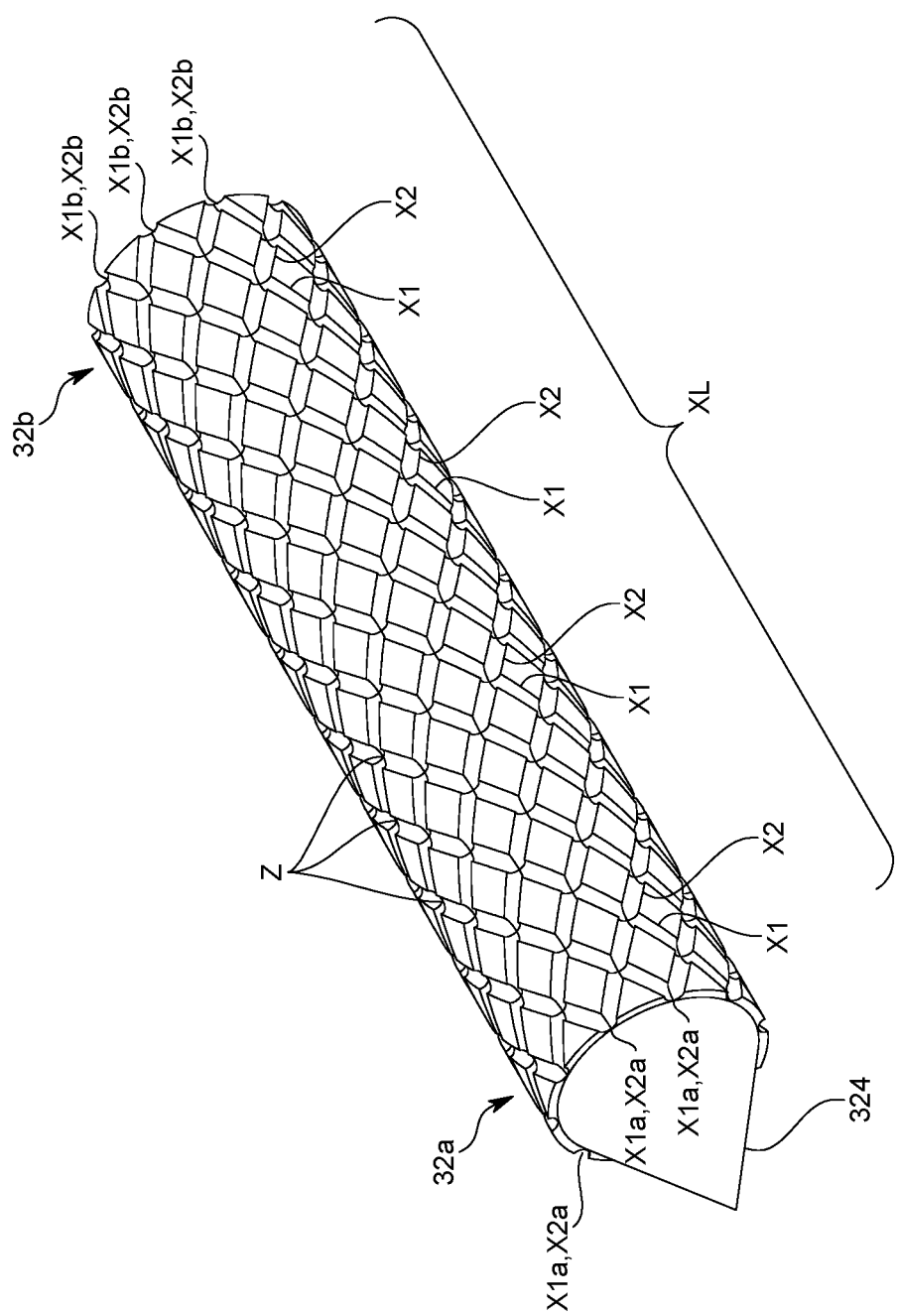
FIG. 3 is a diagram schematically illustrating the configuration of a mixer in another embodiment.

In the following, one embodiment of the vaporization apparatus according to the present invention will be described with reference to drawings.

A vaporization apparatus 100 of the present embodiment is one that is incorporated in, for example, a semiconductor manufacturing line or the like to produce material gas used in a semiconductor manufacturing process, and as illustrated in FIG. 1, includes: a gas-liquid mixing part 10 that mixes (stirring) a liquid material and carrier gas to produce a gas-liquid mixture; and a vaporization part 20 that is introduced with the gas-liquid mixture to vaporize the liquid material contained in the gas-liquid mixture.

The gas-liquid mixing part 10 includes: a carrier gas flow path L1 through which the carrier gas flows; a liquid material flow path L2 through which the liquid material flows; a gas-liquid mixing chamber 10s where the carrier gas flow path L1 and the liquid material flow path L2 merge together; a gas-liquid mixture flow path L3 through which the gas-liquid mixture produced in the gas-liquid mixing chamber 10s flows; and a flow rate regulation valve 11 for regulating the flow rate of the gas-liquid mixture.

In the present embodiment, the carrier gas flow path L1 and the liquid material flow path L2 are formed inside a block body 12, and in a valve seat surface 13 formed on one surface (here, the upper surface) of the block body 12, respective lead-out ports L1a and L2a of the carrier gas flow path L1 and the liquid material flow path L2 are opened.

The flow rate regulation valve 11 is, for example, a piezo valve of a normally closed type, and a valve body 111 is arranged opposite to the above-described valve seat surface 13. In doing so, a space surrounded by the valve body 111 and the valve seat surface 13 is formed as the above-described gas-liquid mixing chamber 10s.

The gas-liquid mixture flow path L3 whose introduction port L3a is formed in the above-described valve seat surface 13 is one that is introduced with the gas-liquid mixture produced in the gas-liquid mixing chamber 10s to guide the gas-liquid mixture to the vaporization part 20.

The above-described configuration allows the valve body 111 to open or close each of the lead-out port L1a of the carrier gas flow path L1, the lead-out port L2a of the liquid material flow path L2, and the introduction port L3a of the gas-liquid mixture flow path L3, and thereby makes it possible to supply or stop supplying the gas-liquid mixture to the vaporization part 20.

The vaporization part 20 is connected with a piping member Z1 forming the gas-liquid mixture flow path L3, and includes: a depressurization flow path L4 for depressurizing the gas-liquid mixture guided through the gas-liquid mixture flow path L3; and a vaporized gas flow path L5 through which vaporized gas flows, which is produced in such a manner that the liquid material contained in the gas-liquid mixture passes through the depressurization flow path L4 and thereby depressurized and vaporized (atomized).

The depressurization flow path L4 is connected with the gas-liquid mixture flow path L3 and the vaporized gas flow path L5, and a nozzle-shaped one whose diameter and length are small as compared with these flow paths.

The vaporization gas flow path L5 is a substantially straight pipe-shaped one whose diameter dimension is larger than the gas-liquid mixture flow path L3, and in the present embodiment, the end part on the depressurization flow path L4 side is formed in a conical shape. In the fluid flowing into the vaporization gas flow path L5, the vaporized gas (gas) resulting from vaporization of the liquid material caused by passage through the depressurization flow path L4 and the atomized liquid material (liquid) are mixed.

In the present embodiment, an unillustrated heating mechanism such as a heater is provided outside the vaporization gas flow path L5, and the heating mechanism heats the vaporization gas flow path L5 to a predetermined set heating temperature (e.g., 300° C.) from outside to vaporize the atomized liquid material.

The vaporization apparatus 100 of the present embodiment is adapted to further include a mixer 30 to which the mixed fluid consisting of the multiple types of fluids such as gas and liquid is guided to mix the multiple types of fluids contained in the mixed fluid. Here, on the downstream side of the above-described depressurization flow path L4, i.e., in the vaporized gas flow path L5, the mixer 30 is provided, and by mixing the atomized liquid material contained in the vaporized gas and the vaporized gas well, the vaporization efficiency of the liquid material is improved.

Specifically, as illustrated in FIGS. 2(A), 2(B), and 2(C), the mixer 30 includes: a flow path forming member 31 formed with an internal flow path 30L through which the mixed fluid flows; and an insertion member 32 inserted into the internal flow path 30L.

The flow path forming member 31 is one formed of a metal material rich in corrosion resistance and heat resistance, such as stainless steel, and formed in a hollow tubular shape. The flow path forming member 31 in the present embodiment is a cylindrical one whose hollow part is formed as the above-described internal flow path 30L, and one end opening 31a is formed as an inflow port for the mixed fluid, whereas the other end opening 31b is formed as an outflow port for the mixed fluid. In doing so, the internal flow path 30L is formed in a linear shape from the inflow port 31a to the outflow port 31b.

The insertion member 32 is one formed of a metal material rich in corrosion resistance and heat resistance, such as stainless steel, and fitted into the flow path forming member 31 by performing shrink fit, expansion fit, or the like in a state of being inserted into the internal flow path 30L. This allows the inner circumferential surface 311 of the flow path forming member 31 and the outer circumferential surface 321 of the insertion member 32 to be fitted and firmly fixed to each other.

Specifically, the insertion member 32 is one formed in a shape insertable into the internal flow path 30L, and here a columnar one such as a circular columnar one having the outer circumferential surface 321 whose diameter dimension is substantially the same as that of the inner circumferential surface 311 forming the internal flow path 30L. The insertion member 32 in the present embodiment is shorter than the internal flow path 30L, and arranged such that the entire outer circumferential surface 321 is opposite to the inner circumferential surface 311 of the flow path forming member 31.

In addition, in the outer circumferential surface 321 of the insertion member 32, first grooves X1 and second grooves X2 merging with the first grooves X1 and branching from the first grooves X1 are formed. Further, by fitting the inner circumferential surface 311 of the flow path forming member 31 and the outer circumferential surface 321 of the insertion member 32 to each other, the first groove X1 and the second groove X2 are formed as a mixing flow path XL for, between the flow path forming member 31 and the insertion member 32, guiding the fluid flowing from one side of the internal flow path 30L to the other side of the internal flow path 30L while repeating branching and merging.

To describe in more detail, the outer circumferential surface 321 of the insertion member 32 is provided with: the multiple first grooves X1 formed from the outer edge of one end part 32a to the outer edge of the other end part 32b; and the multiple second grooves X2 formed from the outer edge of the one end part 32a to the outer edge of the other end part 32b and merging with the first grooves X1.

The first grooves X1 are formed from one end surface 322 (hereinafter referred to as an upstream side end surface 322) to the other end surface 323 (hereinafter referred to as a downstream side end surface 323) of the insertion member 32. As illustrated in FIG. 2(C), the upstream side openings X1a of the respective first grooves X1 formed in the upstream side end surface 322 are provided in mutually different positions at the outer edge of the upstream side end surface 322. Also, as illustrated in FIG. 2(C), the downstream side openings X1b of the respective first grooves X1 formed in the downstream side end surface 322 are provided in mutually different positions at the outer edge of the downstream side end surface 323. In more detail, as viewed from the axial direction of the insertion member 32, the upstream side openings X1a of the respective first grooves X1 are arranged at the outer edge of the upstream side end surface 322 equally in the circumferential direction, and the downstream side openings X1b of the respective first grooves X1 are arranged at the outer edge of the downstream side end surface 323 equally in the circumferential direction.

Specifically, the respective first grooves X1 are spiral ones resulting from cutting by, for example, a ball end mill or the like, whose cross-section is formed in a partially circular shape such as a semicircular shape. The respective first grooves X1 are formed at regular intervals, and circle around the axis several times from the upstream side end surface 322 to downstream side end surface 323 of the insertion member 32.

As with the first grooves X1, the second grooves X2 are formed from the upstream side end surface 322 to downstream side end surface 323 of the insertion member 32. As illustrated in FIG. 2(C), the upstream side openings X2a of the respective second grooves X2 formed in the upstream side end surface 322 are provided in mutually different positions at the outer edge of the upstream side end surface 322. Also, as illustrated in FIG. 2(C), the downstream side openings X2b of the respective second grooves X2 formed in the downstream side end surface 322 are provided in mutually different positions at the outer edge of the downstream side end surface 323. In more detail, as viewed from the axial direction of the insertion member 32, the upstream side openings X2a of the respective second grooves X2 are arranged at the outer edge of the upstream side end surface 322 equally in the circumferential direction, and the downstream side openings X2b of the respective second grooves X2 are arranged at the outer edge of the downstream side end surface 323 equally in the circumferential direction. Further, in the present embodiment, the upstream side openings X1a of the first grooves X1 and the upstream side opening X2a of the second grooves X2 respectively overlap each other, and the downstream side openings X1b of the first grooves X1 and the downstream side openings X2b of the second grooves X2 respectively overlap each other. In addition, the respective upstream side openings X1a and X2a or the respective downstream side openings X1b and X2b do not necessarily have to overlap each other.

Specifically, the respective second grooves X2 are spiral ones resulting from cutting by, for example, a ball end mill or the like, whose cross-section is formed in a partially circular shape such as a semicircular shape. The respective second grooves X2 are formed at regular intervals, and circle around the axis several times from the upstream side end surface 322 to downstream side end surface 323 of the insertion member 32. In the present embodiment, the second grooves X2 whose number is the same as that of the first grooves X1 are formed, and the winding direction of the second grooves X2 is opposite to that of the first grooves X1, and the interval between adjacent second grooves X2 is the same as that between adjacent first grooves X1.

The above-described configuration allows multiple merging points Z at which the first grooves X1 and the second grooves X2 merge together to be provided on the outer circumferential surface 321 of the insertion member 32. When focusing on one first groove X1, the first groove X1 merges with multiple second grooves X2, and specifically with all the second grooves X2. Also, when focusing on one second groove X2, the second groove X2 merges with multiple first grooves X1, and specifically with all the first grooves X1. In addition, the merging points Z also serve as branching points.

Further, the insertion member 32 is fitted into the internal flow path 30L, and thereby the respective first grooves X1 and the respective second grooves X2 are covered with the inner circumferential surface 311 of the flow path forming member 31. As a result, the respective first grooves X1 and the respective second grooves X2 serve as the mixing flow path XL for guiding the fluid flowing upstream of the insertion member 32 to the downstream side of the insertion member 32. That is, the upstream side openings X1a and X2a of the respective first and second grooves X1 and X2 serve as fluid inflow ports, and the downstream side openings X1b and X2b of the respective first and second grooves X1 and X2 serve as fluid outflow ports.

As a result, the fluid flowing from the upstream side openings X1a and X2a of the respective first and second grooves X1 and X2 flows while repeating branching and merging at the multiple merging points Z at which the first grooves X1 and the second grooves X2 merge together, and outflows from the downstream side openings X1b and X2b of the respective first and second grooves X1 and X2.

In the vaporization apparatus 100 according to the present embodiment configured as described above, since when the mixed fluid in which the vaporized gas and the liquid material are mixed is guided to the mixer 30, the mixed fluid flows through the first groove X1 and the second groove X2 while repeating branching and merging, the vaporized gas and the liquid material can be mixed well, and as compared with a vaporization apparatus using, for example, a static mixer as the mixer 30, mixing performance can be improved without causing an increase in the size of the apparatus.

Also, when using a static mixer as the mixer 30, the static mixer is cooled by vaporization of the liquid material. In particular, the vaporization efficiency of the central part is reduced because external heat is less likely to transfer, and therefore a calorific value necessary to obtain sufficient vaporization performance increases.

On the other hand, when using the mixer 30 of the present embodiment, the fluid flowing through the respective grooves X1 and X2 flows along between the inner circumferential surface 311 of the flow path forming member 31 and the outer circumferential surface 321 of the insertion member 32, and therefore external heat can be efficiently transferred to the fluid, thus makes it possible to decrease the calorific value necessary to obtain sufficient vaporization performance.

Further, since the cross section of the first and second grooves X1 and X2 is formed in a partially circular shape such as a semicircular shape, after cutting the outer circumferential surface 321 of the insertion member 32 to form the grooves X1 and X2, secondary working such as polishing can be easily performed.

Note that the present invention is not limited to the above-described embodiment.

For example, the insertion member 32 is of a circular columnar shape in the above-described embodiment, but as illustrated in FIG. 3, may have a guide surface 324 of a tapered shape that gradually tapers toward the upstream side. The guide surface 324 is provided on the upstream side end part 32a of the insertion member 32, and specifically formed in a conical shape.

Such a configuration makes it possible to easily guide the fluid flowing through the internal flow path 30L and reaching the insertion member 32 to the respective grooves X1 and X2, as well as makes it possible to reduce resistance to the fluid reaching the insertion member 32.

Figure 4B:
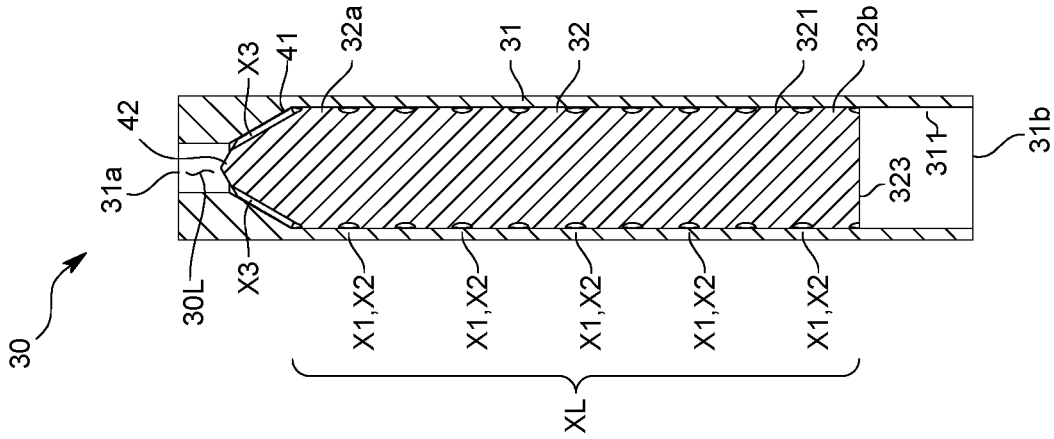
FIGS. 4(A) and 4(B) are diagrams schematically illustrating the configuration of a mixer in still another embodiment.
Figure 4A:
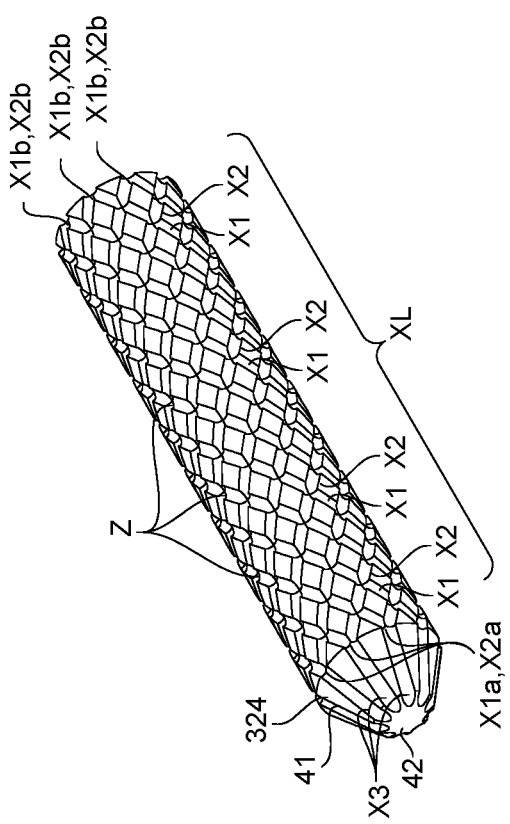

Also, as illustrate in FIGS. 4(A) and 4(B), the above-described guide surface 324 may be provided with multiple guide grooves X3.

The guide grooves X3 are ones communicating with the first groove X1 and the second groove X2, and formed by cutting by, for example, a ball end mill or the like, and the cross-section thereof is formed in a partially circular shape such as a semicircular shape.

To describe more specifically, here, on the upstream side end part 32a of the insertion member 32, a first conical part 41 is provided, and also on the fore end part of the first conical part 41, a second conical part 42 whose inclination angle is smaller than that of the first conical part is provided. Further, the guide grooves X3 are linearly formed from the boundary part between the first conical part 41 and the second conical part 42 to the upstream side openings X1a and X2a of the first and second grooves X1 and X2. In addition, the shape of the guide grooves X3 is not limited to a linear shape but may be a spiral shape or a curved shape.

By forming such guide grooves X3, the fluid can be more easily guided to the first grooves X1 and the second grooves X2.

Further, as illustrated in FIGS. 4(A) and 4(B), the flow path forming member 31 may be such that the inflow port 31a and the outflow port 31b are of different sizes. Here, the inflow port 31a is formed smaller in size than the outflow port 31b, and specifically, the inflow port 31a is formed to have the same size as the diameter dimension of the above-described boundary part between the first conical part 41 and the second conical part 42, whereas the outflow port 31b is formed to have substantially the same size as the diameter dimension of the downstream side end surface 323 of the insertion member 32.

Figure 5:
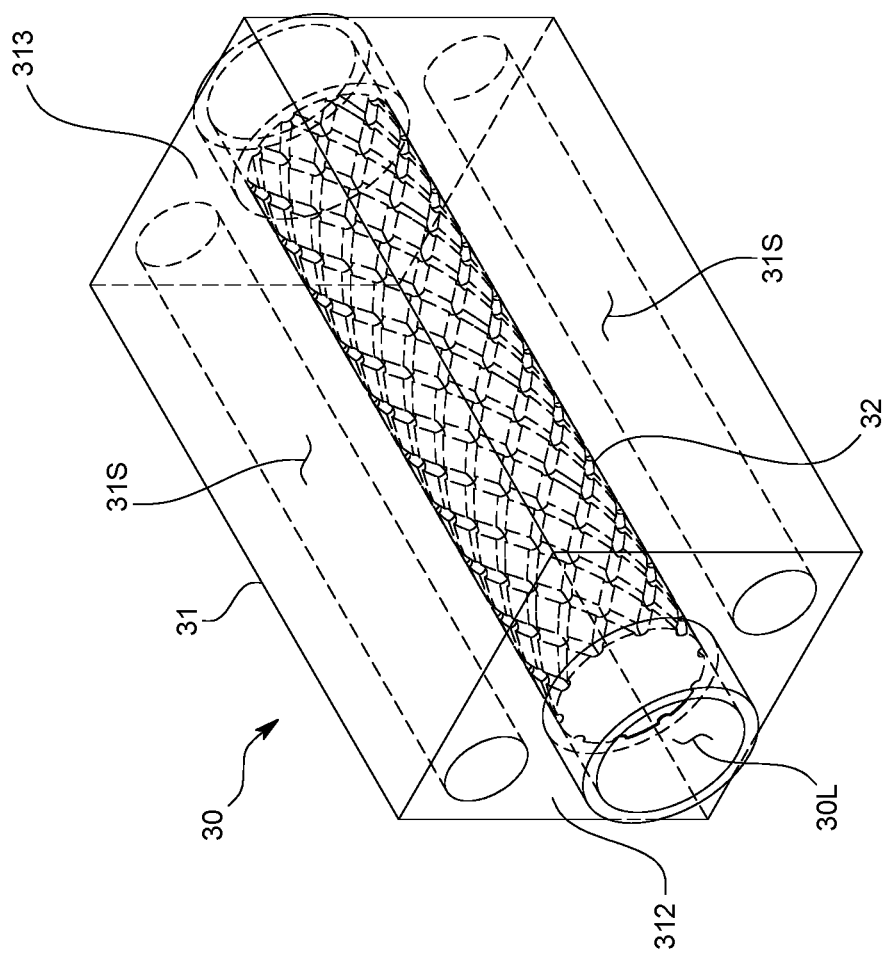
FIG. 5 is a diagram schematically illustrating the configuration of a mixer in yet another embodiment.

The flow path forming member 31 may be one that as illustrated in FIG. 5, is formed in, for example, a block shape, and contains first heaters (not illustrated) for heating the fluid flowing through the internal flow path 30L. Specifically, the flow path forming member 31 has first heater containing spaces 31S formed penetrating through the upstream side end surface 312 and downstream side end surface 313, and here the paired first heater containing spaces 31S are formed interposing the internal flow path 30L. In addition, the number and arrangement of the first heater containing spaces 31S are not limited to those in the embodiment illustrated in FIG. 5, but may be appropriately changed.

Such a configuration makes it possible to heat the fluid flowing through the mixing flow path XL from outside by the first heaters contained in the first heater containing spaces 31S. Also, the mixer 30 and the first heaters can be unitized, thus enabling downsizing.

Further, as illustrated in FIGS. 6(A), 6(B), and 6(C), the insertion member 32 may be one having a second heater containing space 32S containing a second heater (not illustrated) for heating the fluid.

To described in more detail, the insertion member 32 has a through-hole formed from one end surface of the upstream side end surface 322 and the downstream side end surface 323 toward the other end surface until before reaching the other end surface, and the through-hole serves as the second heater containing space 32S.

On the other hand, the flow path forming member 31 is formed in a block body shape, and has a first through-hole H1 communicating between a first port 5a formed in a first wall surface 51 and a second port 5b formed in a second wall surface 52 on the side opposite to the first wall surface 51, and the insertion member 32 is inserted into the first through-hole H1.

Here, the insertion member 32 is inserted through the second port 5b, and the second port 5b is blocked by a blocking member 6 in order to prevent the fluid from flowing out. In addition, the shape and the like of the blocking member 6 may be appropriately changed, but here is formed in a block body shape having a blocking surface of substantially the same shape as the second wall surface 52 of the flow path forming member 31 in a plan view and formed integrally with the insertion member 32. Also, the blocking member 6 is formed with a through-hole 6H communicating with the second heater containing space 32S.

Further, the flow path forming member 31 has a second through hole H2 communicating between a third port 5c formed in a wall surface 53 different from the second wall surface 52 and the first through-hole H1. Here, the third port 5c is formed in the third wall surface 53 perpendicular to the first and second wall surfaces 51 and 52, but may be formed in the first wall surface 51. In such a configuration, one of the first port 5a and the third port 5c serves as a fluid inflow port, and the other serves as a fluid outflow port.

In addition, although not illustrated, a fourth port may be formed in a wall surface different from the first wall surface 51 and the second wall surface 52, such as the third wall surface 53 or a fourth wall surface on the side opposite to the third wall surface 53, and also a third through-hole communicating between the fourth port 5d and the first through-hole H1 may be formed to make the fourth port serve as an inflow port or an outflow port.

Figure 7:
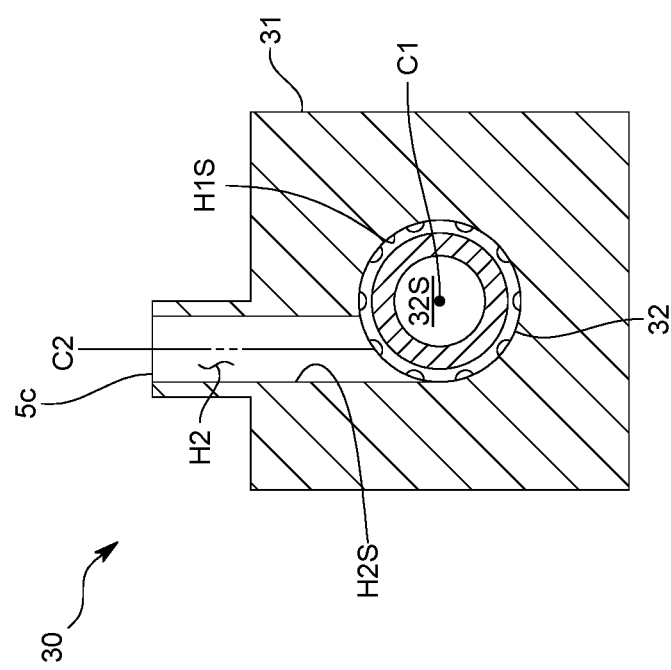
FIG. 7 is a diagram schematically illustrating the configuration of a mixer in a further embodiment.

Further, as illustrated in FIG. 7, the above-described second through-hole H2 is preferably connected so that at the connection point with the first through-hole H1, the fluid flows along a tangential direction of the inner circumferential surface H1S forming the first through-hole H1. Specifically, a configuration in which in a cross section perpendicular to the central axis C1 of the first through-hole H1, the central axis C2 of the second through-hole H2 is displaced from the central axis C1 of the insertion member 32, and a part H2S positioned on the inner circumferential surface forming the second through-hole H2 on the side opposite to the central axis C1 extends along the tangential direction of the inner circumferential surface H1S of the first through-hole H1 can be cited.

Such a configuration makes it possible to generate a swirling flow along the first through-hole H1 and thereby make the fluid efficiently flow in/out.

The vaporization apparatus configured as described above can heat the fluid flowing through the mixing flow path from inside by the second heater contained in the second heater containing space.

The flow path forming member is a cylindrical one in the above-described embodiment, but may be, for example, a tubular one whose cross section is triangular, quadrangular, or polygonal.

The insertion member is a circular columnar one in the above-described embodiment, but may be, for example, a columnar or tubular one whose cross section is triangular, quadrangular, or polygonal.

The cross sections of the first groove and the second groove are of a partially circular shape such as a semicircular shape in the above-described embodiment, but may be of a triangular shape, quadrangular shape, polygonal shape, or the like. In addition, a method for forming the grooves is not limited to the cutting, but may be, for example, knurling or the like.

Further, the first groove and the second groove are of a spiral shape in the above-described embodiment. However, for example, the first grooves may be linearly formed parallel to the internal flow path, and the second grooves may be connected to mutually adjacent first grooves and also formed inclined with respect to the first grooves. That is, the shapes of the first groove and the second groove may be changed to various shapes as long as the first groove and the second groove enable the fluid to repeat branching and merging.

The internal flow path is not required to be entirely linear from the inflow port to the outflow port. As long as the internal flow path is at least partially linear from the inflow port to the outflow port, the same working effects as those of the above-described embodiment can be obtained by arranging the mixer in the linear part.

In the above-described embodiment, described is the case where the first grooves and the second grooves are formed on the outer circumferential surface of the insertion member. However, the first grooves and the second grooves may be formed on the inner circumferential surface of the flow path forming member.

Figure 8:
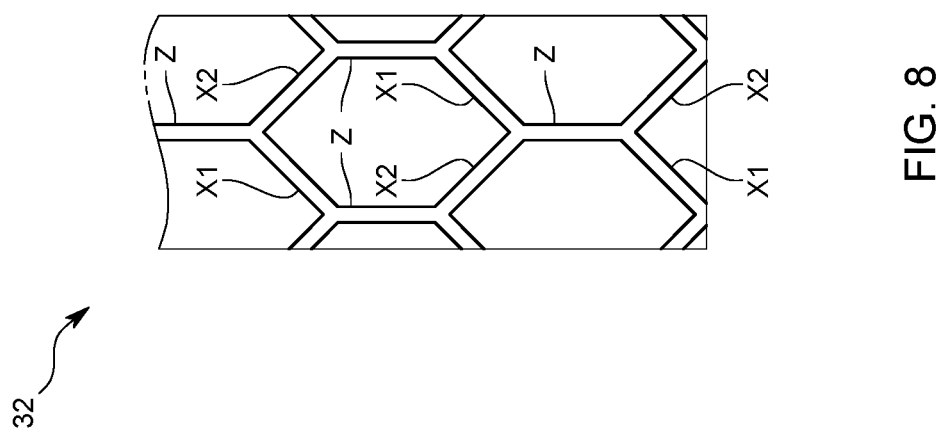
FIG. 8 is a diagram schematically illustrating the configuration of a mixer in a still further embodiment.

Further, as illustrated in FIG. 8, the merging points Z between the first grooves X1 and the second grooves X2 may be configured to be, for example, ranges extending by a predetermined length along the axial direction of the insertion member 32.

Figure 9:
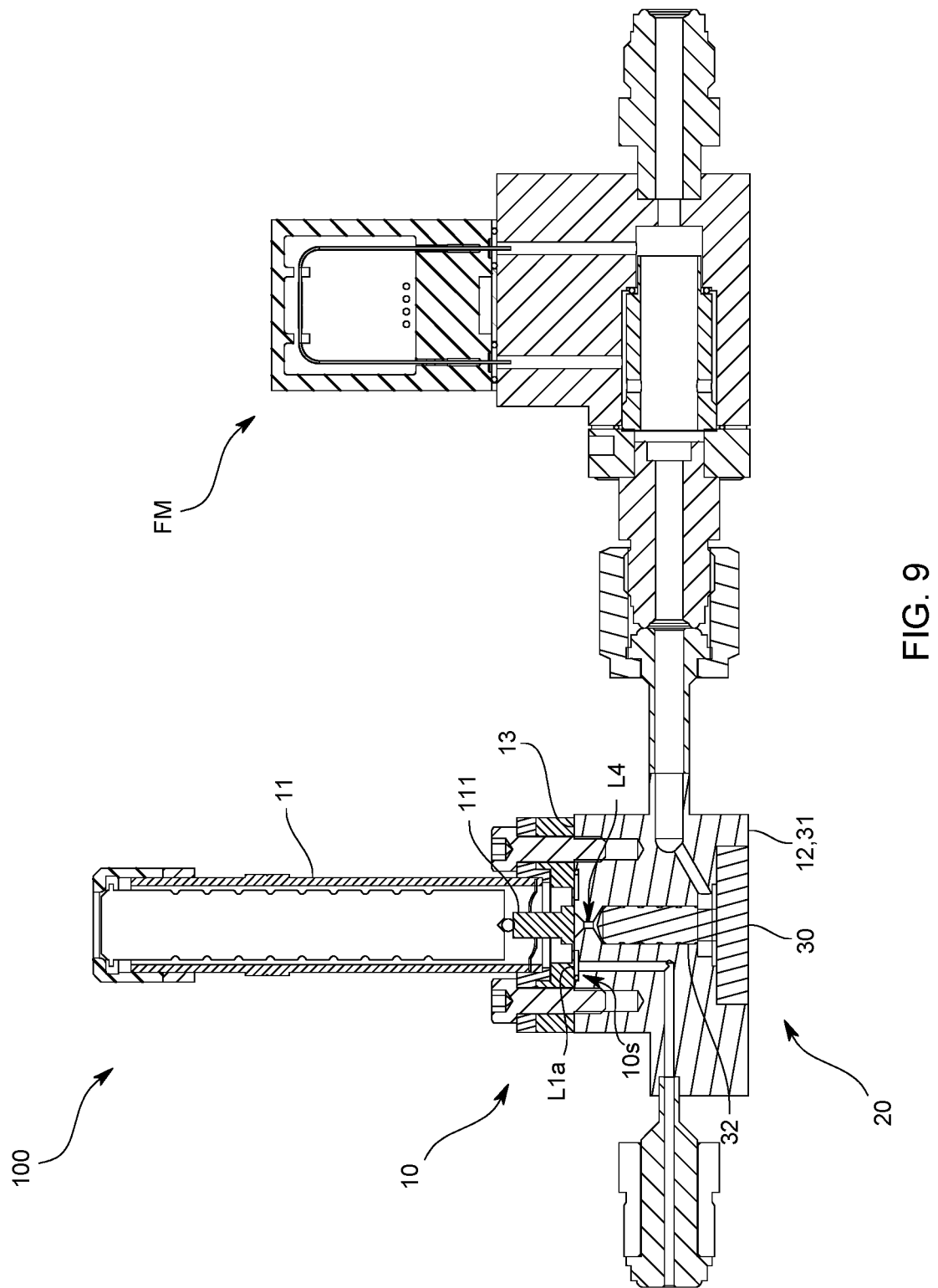
FIG. 9 is a diagram schematically illustrating the overall configuration of a vaporization apparatus in a still yet further embodiment.

In addition, the arrangement of the mixer is not limited to that in the above-described embodiment. For example, as illustrated in FIG. 9, the mixer 30 may be arranged in a gas-liquid mixture flow path L3b through which the gas-liquid mixture produced in the gas-liquid mixing chamber 10s flows. In this embodiment, a block body 12 in which a depressurization flow path L4 is formed as an internal flow path serves as the flow path forming member 31, and the insertion member 32 is inserted in the flow path forming member 31 along the moving direction of the valve body 111 (here, in the up-down direction). Further, in this embodiment, gas is not introduced into the gas-liquid mixing chamber 10s, but liquid is introduced, and the liquid is depressurized while being heated in the depressurization flow path L4, and thereby vaporized. On the downstream side of the mixer 30, a flowmeter MF (in this embodiment, a thermal type flowmeter) is provided, and depending on a gas flow rate measured by the flowmeter MF, the valve opening level of the flow rate regulation valve 11 is controlled.

Further, in the above-described embodiment, the mixer is provided on the downstream side of the depressurization flow path. However, the mixer according to the present invention may be arranged on the upstream side of the depressurization flow path. In doing so, the liquid material and the carrier gas can be mixed well, and therefore a good atomized state having no intermittency, inclined injection, or the like can be established in the depressurization flow path, thus making it possible to improve vaporization efficiency.

In addition, when using the mixer according to the present invention to mix the liquid material and the carrier gas, the vaporization apparatus may be one not including the depressurization flow path.

Further, in the above-described embodiment, the mixer is used to mix the multiple types of fluids. However, the mixer according to the present invention may be used to mix, for example, particles and fluid. Also, the multiple types of fluids may be fluids whose states including concentration, temperature, and the like are mutually different.

Also, in the above-described embodiment, described is the case where the mixer is used for the vaporization apparatus. However, the mixer according to the present invention may be used for a heat exchanger or the like, or for, for example, an apparatus for mixing and chemically reacting multiple types of fluids.

Note that the following structure is one also included in the present invention as with the above-described mixer.

That is, the structure according to the present invention includes: a first member having an internal flow path (corresponding to the flow path forming member in the above-described embodiment); and a second member provided in the internal flow path (corresponding to the insertion member in the above-described embodiment), in which the inner circumferential surface of the first member and the outer circumferential surface of the second member are in contact with each other; the inner circumferential surface or the outer circumferential surface have a first groove and a second groove merging with the first groove and branching from the first groove; and the first groove and the second groove are formed as a flow path for, between the first member and the second member, branching and merging fluid flowing from one side of the internal flow path and guiding the fluid to the other side of the internal flow path.

Besides, it should be appreciated that the present invention is not limited to the above-described embodiments, but can be variously modified without departing from the scope thereof.

LIST OF REFERENCE CHARACTERS

100: Vaporization apparatus
30: Mixer
30L: Internal flow path
31: Flow path forming member
32: Insertion member
X1: First groove
X2: Second groove
XL: Mixing flow path
Z: Merging point

The invention claimed is:

1. A vaporization apparatus that vaporizes fluid to produce vaporized gas, the vaporization apparatus comprising:
a depressurization flow path configured to depressurize and atomize a gas-liquid mixture introduced therein;
a mixer, arranged downstream of the depressurization flow path, comprising:
a flow path forming member formed with an internal flow path; and
an insertion member inserted into the internal flow path, wherein
an inner circumferential surface forming the internal flow path in the flow path forming member or an outer circumferential surface of the insertion member is formed with a first groove and a second groove merging with the first groove and branching from the first groove, and the inner circumferential surface and the outer circumferential surface are fitted to each other;
the first groove and the second groove are formed as a mixing flow path for, between the flow path forming member and the insertion member, branching and merging the fluid flowing from one side of the internal flow path and guiding the fluid to the other side of the internal flow path;
a direction of the gas-liquid mixture traveling through the depressurization flow path and into the mixer is axial with respect to the insertion member;
the insertion member has a guide surface on its upstream side which gradually tapers towards an upstream direction; and
an upstream side opening of the first groove and an upstream side opening of the second groove respectively overlap each other.

2. The vaporization apparatus according to claim 1, wherein:
multiple first grooves are formed in the outer circumferential surface of the insertion member from an outer edge of one end part of the insertion member to an outer edge of the other end part of the insertion member;
multiple second grooves are formed in the outer circumferential surface of the insertion member from the outer edge of the one end part of the insertion member to the outer edge of the other end part of the insertion member; and
multiple branching points or multiple merging points between the first grooves and the second grooves are provided.

3. The vaporization apparatus according to claim 2, wherein
the first grooves and the second grooves are of a spiral shape, and a winding direction of the first grooves and a winding direction of the second grooves are opposite to each other.

4. The vaporization apparatus according to claim 1, wherein
the flow path forming member includes a first heater containing space containing a first heater for heating the fluid.

5. The vaporization apparatus according to claim 4, wherein
the insertion member includes a second heater containing space containing a second heater for heating the fluid.

6. The vaporization apparatus according to claim 5, wherein:
the flow path forming member is formed in a block body shape, and includes a first through-hole that communicates between a first port formed in a first wall surface and a second port formed in a second wall surface on a side opposite to the first wall surface, the insertion member being inserted into the first through-hole, and a second through-hole that communicates between a third port formed in a wall surface different from the second wall surface and the first through-hole;
the second port is blocked with the second heater inserted into the second heater containing space through the second port; and
one of the first port and the third port is formed as an inflow port for the fluid, and also the other is formed as an outflow port for the fluid.

7. The vaporization apparatus according to claim 6, wherein
at a connection point between the first through-hole and the second through-hole, the fluid flows along a tangential direction of an inner circumferential surface forming the first through-hole.

8. The vaporization apparatus according to claim 1, wherein multiple guide grooves each communicating with a respective one of the first groove and the second groove are formed in the guide surface.

9. The vaporization apparatus according to claim 1, wherein
cross-sections of the first groove and the second groove are formed in a partially circular shape.

10. The vaporization apparatus according to claim 1, wherein
the guide surface of the insertion member is formed by a first conical part and a second conical part which respectively have different inclination angles.

11. The vaporization apparatus according to claim 1, wherein
the flow path forming member comprises a pair of heaters for heating the fluid, the heaters arranged such that a longitudinal direction of the heaters extends along an axial direction of the insertion member.

\* \* \* \* \*